United States Patent
Deak et al.

(10) Patent No.: US 7,002,228 B2
(45) Date of Patent: Feb. 21, 2006

(54) DIFFUSION BARRIER FOR IMPROVING THE THERMAL STABILITY OF MRAM DEVICES

(75) Inventors: James G. Deak, Boise, ID (US); Maciej M. Kowalewski, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 281 days.

(21) Appl. No.: 10/368,804

(22) Filed: Feb. 18, 2003

(65) Prior Publication Data

US 2004/0160810 A1 Aug. 19, 2004

(51) Int. Cl.
    *H01L 29/82* (2006.01)
(52) U.S. Cl. ............... 257/421; 257/295; 257/E27.006
(58) Field of Classification Search ................ 257/421, 257/295, E27.006
    See application file for complete search history.

(56) References Cited

U.S. PATENT DOCUMENTS

| | | | |
|---|---|---|---|
| 4,780,848 A | 10/1988 | Daughton et al. | 365/173 |
| 5,587,943 A | 12/1996 | Torok et al. | 365/158 |
| 5,640,343 A | 6/1997 | Gallagher et al. | 365/171 |
| 5,659,499 A | 8/1997 | Chen et al. | 385/158 |
| 5,748,524 A | 5/1998 | Chen et al. | 365/173 |
| 5,793,697 A | 8/1998 | Scheuerlein | 365/230.07 |
| 5,861,328 A | 1/1999 | Tehrani et al. | 438/210 |
| 5,956,267 A | 9/1999 | Hurst et al. | 365/158 |
| 5,966,323 A | 10/1999 | Chen et al. | 365/158 |
| 5,986,858 A | 11/1999 | Sato et al. | 360/113 |
| 6,005,800 A | 12/1999 | Koch et al. | 428/692 |
| 6,034,887 A | 3/2000 | Gupta et al. | 365/171 |
| 6,081,446 A | 6/2000 | Brug et al. | 365/171 |
| 6,097,625 A | 8/2000 | Scheuerlein et al. | 365/171 |
| 6,097,626 A | 8/2000 | Brug et al. | 365/171 |
| 6,104,633 A | 8/2000 | Abraham et al. | 365/171 |
| 6,134,139 A | 10/2000 | Bhattacharyya et al. | 365/171 |
| 6,166,948 A | 12/2000 | Parkin et al. | 365/173 |
| 6,172,904 B1 | 1/2001 | Anthony et al. | 365/173 |
| 6,174,737 B1 | 1/2001 | Durlam et al. | 438/3 |
| 6,191,972 B1 | 2/2001 | Miura et al. | 365/171 |
| 6,191,973 B1 | 2/2001 | Moyer | 365/173 |
| 6,211,090 B1 | 4/2001 | Durlam et al. | 438/692 |
| 6,211,559 B1 | 4/2001 | Zhu et al. | 257/421 |
| 6,219,212 B1 | 4/2001 | Gill et al. | 360/324.2 |
| 6,219,275 B1 | 4/2001 | Nishimura | 365/173 |

(Continued)

OTHER PUBLICATIONS

Cardoso, S. , et al., "Spin-tunnel-junction thermal stability and interface interdiffusion above 300°C", *Applied Physics Letters*, 76(5), (Jan. 31, 2000),610-612.

(Continued)

*Primary Examiner*—Tu-Tu Ho
(74) *Attorney, Agent, or Firm*—Schwegman, Lundberg, Woessner & Kluth, P.A.

(57) ABSTRACT

A magnetic random access memory device including a pinned layer having a diffusion barrier, a sense layer, and a tunnel barrier to electrically couple the pinned layer to the sense layer. A method for forming a magnetic random access memory device including forming, on a substrate, a sense layer, forming a tunnel barrier on the sense layer, forming a pinned layer on the tunnel barrier, where the pinned layer includes a diffusion barrier to stop manganese atoms from diffusing to the interface of the tunnel barrier, and annealing the substrate, the sense layer, the tunnel barrier and the pinned layer. The diffusion barrier can include a native oxide having a thickness up to about seven angstroms or an aluminum oxide having a thickness up to about seven angstroms.

69 Claims, 8 Drawing Sheets

U.S. PATENT DOCUMENTS

| | | | |
|---|---|---|---|
| 6,226,160 B1 | 5/2001 | Gallagher et al. | 360/324.2 |
| 6,233,172 B1 | 5/2001 | Chen et al. | 365/173 |
| 6,242,770 B1 | 6/2001 | Bronner et al. | 257/295 |
| 6,256,223 B1 | 7/2001 | Sun | 365/171 |
| 6,256,247 B1 | 7/2001 | Perner | 365/209 |
| 6,259,586 B1 | 7/2001 | Gill | 360/324.2 |
| 6,269,018 B1 | 7/2001 | Monsma et al. | 365/145 |
| 6,326,637 B1 * | 12/2001 | Parkin et al. | 257/9 |
| 6,358,757 B1 | 3/2002 | Anthony | |
| 6,392,922 B1 | 5/2002 | Liu et al. | |
| 6,430,085 B1 | 8/2002 | Rizzo | 365/173 |
| 6,510,080 B1 | 1/2003 | Farrar | 365/171 |
| 6,525,957 B1 | 2/2003 | Goronkin et al. | 365/158 |
| 6,538,917 B1 | 3/2003 | Tran et al. | |
| 6,570,783 B1 | 5/2003 | Deak | |
| 6,623,987 B1 | 9/2003 | Liu et al. | |
| 6,627,932 B1 | 9/2003 | Drewes | |
| 6,656,371 B1 | 12/2003 | Drewes | |
| 6,677,631 B1 | 1/2004 | Drewes | |
| 6,683,806 B1 | 1/2004 | Drewes | |
| 6,689,622 B1 | 2/2004 | Drewes | |
| 6,707,084 B1 | 3/2004 | Katti et al. | |
| 6,716,644 B1 | 4/2004 | Nejad et al. | |
| 6,724,652 B1 | 4/2004 | Deak | |
| 6,728,132 B1 | 4/2004 | Deak | |
| 6,740,947 B1 | 5/2004 | Bhattacharyya et al. | |
| 6,743,641 B1 | 6/2004 | Yates et al. | |
| 6,765,823 B1 | 7/2004 | Zhu et al. | |
| 6,771,533 B1 | 8/2004 | Witcraft et al. | |
| 6,780,653 B1 | 8/2004 | Nejad et al. | |
| 6,780,654 B1 | 8/2004 | Nejad et al. | |
| 6,781,173 B1 | 8/2004 | Tuttle et al. | |
| 6,781,174 B1 | 8/2004 | Nejad et al. | |
| 6,806,546 B1 | 10/2004 | Liu et al. | |
| 6,807,087 B1 | 10/2004 | Deak | |
| 6,816,402 B1 | 11/2004 | Deak | |
| 6,828,639 B1 | 12/2004 | Nejad et al. | |
| 6,833,278 B1 | 12/2004 | Deak | |
| 6,845,036 B1 | 1/2005 | Witcraft et al. | |
| 6,849,464 B1 | 2/2005 | Drewes | |
| 6,852,550 B1 | 2/2005 | Tuttle et al. | |
| 6,870,714 B1 | 3/2005 | Drewes | |
| 6,870,759 B1 | 3/2005 | Tsang | |
| 6,881,993 B1 | 4/2005 | Drewes et al. | |
| 6,885,073 B1 | 4/2005 | Drewes | |
| 6,885,576 B1 | 4/2005 | Deak | |
| 6,900,455 B1 | 5/2005 | Drewes | |
| 6,900,489 B1 | 5/2005 | Drewes | |
| 6,902,940 B1 | 6/2005 | Drewes | |
| 6,903,399 B1 | 6/2005 | Katti et al. | |
| 6,906,396 B1 | 6/2005 | Tuttle et al. | |
| 6,906,950 B1 | 6/2005 | Zhu et al. | |
| 2001/0025978 A1 | 10/2001 | Nakao | 257/314 |
| 2001/0036675 A1 | 11/2001 | Anthony | 438/3 |
| 2001/0036699 A1 | 11/2001 | Slaughter | 438/240 |
| 2002/0044396 A1 * | 4/2002 | Amano et al. | 360/324.2 |
| 2002/0074541 A1 * | 6/2002 | Covington | 257/9 |
| 2002/0080645 A1 | 6/2002 | Liu | |
| 2002/0085412 A1 | 7/2002 | Liu et al. | |
| 2003/0024465 A1 * | 2/2003 | Perner et al. | 116/217 |
| 2003/0059958 A1 | 3/2003 | Drewes | |
| 2003/0090932 A1 | 5/2003 | Deak | |
| 2003/0119210 A1 | 6/2003 | Yates et al. | |
| 2003/0132494 A1 | 7/2003 | Tuttle et al. | |
| 2003/0146459 A1 | 8/2003 | Katti et al. | |
| 2003/0161079 A1 * | 8/2003 | Takahashi et al. | 360/324.11 |
| 2003/0185045 A1 | 10/2003 | Drewes | |
| 2003/0189842 A1 | 10/2003 | Deak | |
| 2003/0194819 A1 | 10/2003 | Drewes | |
| 2003/0207486 A1 | 11/2003 | Deak | |
| 2003/0216032 A1 | 11/2003 | Nejad et al. | |
| 2003/0228710 A1 | 12/2003 | Drewes | |
| 2003/0228711 A1 | 12/2003 | Nejad | |
| 2003/0228713 A1 | 12/2003 | Nejad | |
| 2003/0228726 A1 | 12/2003 | Nejad | |
| 2003/0235068 A1 | 12/2003 | Deak | |
| 2004/0012056 A1 | 1/2004 | Nejad et al. | |
| 2004/0012895 A1 | 1/2004 | Drewes et al. | |
| 2004/0014243 A1 | 1/2004 | Drewes | |
| 2004/0017639 A1 | 1/2004 | Deak | |
| 2004/0018645 A1 | 1/2004 | Drewes | |
| 2004/0027844 A1 | 2/2004 | Nejad et al. | |
| 2004/0032765 A1 | 2/2004 | Deak | |
| 2004/0041182 A1 | 3/2004 | Tuttle et al. | |
| 2004/0041184 A1 | 3/2004 | Tuttle et al. | |
| 2004/0042128 A1 * | 3/2004 | Slaughter et al. | 360/324.2 |
| 2004/0042246 A1 * | 3/2004 | Drewes et al. | 365/145 |
| 2004/0042258 A1 | 3/2004 | Witcraft | |
| 2004/0042260 A1 | 3/2004 | Deak | |
| 2004/0042315 A1 | 3/2004 | Drewes | |
| 2004/0052150 A1 | 3/2004 | Drewes | |
| 2004/0061154 A1 * | 4/2004 | Huai et al. | 257/295 |
| 2004/0062081 A1 | 4/2004 | Drewes | |
| 2004/0066667 A1 | 4/2004 | Deak | |
| 2004/0091634 A1 | 5/2004 | Liu et al. | |
| 2004/0119095 A1 | 6/2004 | Tuttle et al. | |
| 2004/0124485 A1 | 7/2004 | Yates et al. | |
| 2004/0145943 A1 | 7/2004 | Zhu et al. | |
| 2004/0150059 A1 | 8/2004 | Drewes | |
| 2004/0152218 A1 | 8/2004 | Deak | |
| 2004/0152265 A1 | 8/2004 | Nejad et al. | |
| 2004/0166618 A1 | 8/2004 | Deak | |
| 2004/0180237 A1 | 9/2004 | Drewes | |
| 2004/0183099 A1 | 9/2004 | Katti et al. | |
| 2004/0195639 A1 | 10/2004 | Drewes | |
| 2004/0201070 A1 | 10/2004 | Deak | |
| 2004/0202018 A1 | 10/2004 | Witcraft et al. | |
| 2004/0217399 A1 | 11/2004 | Drewes | |
| 2004/0217403 A1 | 11/2004 | Drewes | |
| 2004/0227244 A1 | 11/2004 | Liu et al. | |
| 2004/0234815 A1 | 11/2004 | Drewes | |
| 2004/0240264 A1 | 12/2004 | Zhu et al. | |
| 2005/0003562 A1 | 1/2005 | Drewes | |
| 2005/0030786 A1 | 2/2005 | Deak | |
| 2005/0040453 A1 | 2/2005 | Nejad et al. | |
| 2005/0041463 A1 | 2/2005 | Drewes | |
| 2005/0047263 A1 | 3/2005 | Drewes et al. | |
| 2005/0078512 A1 | 4/2005 | Deak | |
| 2005/0079638 A1 | 4/2005 | Drewes et al. | |
| 2005/0099844 A1 | 5/2005 | Witcraft et al. | |
| 2005/0122773 A1 | 6/2005 | Deak | |
| 2005/0146912 A1 | 7/2005 | Deak | |

OTHER PUBLICATIONS

Gillies, M. F., et al., "Effect of thin oxide layers incorporated in spin valve structures", *Journal of Applied Physics*, 89(11), (Jun. 1, 2001), 6922-6924.

Gillies, M. F., "Enhancement of the giant magnetoresistance in spin valves via oxides formed from magnetic layers", *Journal of Applied Physics*, 88(10), (Nov. 15, 2000), 5894-5898.

Lai, Chih-Huang, et al., "Giant magnetoresistance enhancement in spin valves with nano-oxide layers", *Journal of Applied Physics*, 89(11), (Jun. 1, 2001), 6928-6930.

Roos, B. F., et al., "Auger electron spectroscopic studies of annealing effects at Fe/FeOx/Al and Co/CoOx/Al interfaces", *Surface Science*, 497(1-3), (Jan. 20, 2002), L55-L59.

Sant, S., et al., "Giant magnetoresistance in ion beam deposited spin-valve films with specular enhancement",

*Journal of Applied Physics,* 89(11), (Jun. 1, 2001), 6931-6933.

Veloso, A., et al., "Magnetoresistance enhancement in specular, bottom-pinned, Mn83lr17 spin valves with nano-oxide layers", *Applied Physics Letters,* 77(7), (Aug. 14, 2000), 1020-1022.

* cited by examiner

DIFFUSION BARRIER FOR IMPROVING THE THERMAL STABILITY OF MRAM DEVICES

FIELD OF THE INVENTION

The present invention relates to magnetic devices and, more particularly, to magnetic random access memory (MRAM) devices.

BACKGROUND OF THE INVENTION

A magnetic random access memory (MRAM) device includes a tunnel junction, or tunnel barrier, that separates a pinned layer that includes a ferromagnet and an antiferromagnet from a sense layer, also known as a free layer, that includes a ferromagnet. In operation, the magnetic orientation of the sense layer in the MRAM device is switched between a magnetic orientation that is parallel and an orientation that is anti-parallel to the magnetic orientation of the pinned layer of the MRAM device. The resistance of the MRAM device varies with the orientation of the magnetization of the sense layer with respect to the pinned layer.

The magnetization of the pinned layer in an MRAM device is set during the manufacture of the MRAM device. The process for setting the magnetization of the pinned layer often includes heating the MRAM device to assist in aligning the magnetization of the pinned layer. During the heating, manganese atoms from a iridium-manganese antiferromagnet in the pinned layer can diffuse and accumulate at the tunnel junction (tunnel barrier) of the MRAM device. This unintended accumulation of manganese atoms at the tunnel junction (tunnel barrier) can degrade or destroy the magnetoresistive properties of the MRAM device.

For these and other reasons there is a need for the present invention.

SUMMARY OF THE INVENTION

The above mentioned problems related to magnetic random access memory devices and systems that include magnetic random access memory devices, as well as other problems, are addressed by the present invention and will be understood by reading and studying the following specification.

In an embodiment, a magnetic random access memory device includes a pinned layer having a diffusion barrier, a sense layer, and a tunnel barrier to electrically couple the pinned layer to the sense layer.

In an embodiment, a magnetic random access memory device includes a pinned layer having a thin film of aluminum oxide with a thickness of between a monolayer and about seven angstroms, a sense layer, and a tunnel barrier to electrically couple the pinned layer to the sense layer.

In an embodiment, a magnetic random access memory device includes a pinned layer having a thin film of aluminum oxide, a sense layer, a tunnel barrier to electrically couple the pinned layer to the sense layer, and a control unit to electrically and magnetically couple to the sense layer.

In an embodiment, a magnetic random access memory includes a plurality of magnetic random access memory devices formed on a substrate, each of the plurality of magnetic random access memory devices including a pinned layer having a diffusion barrier embedded in the pinned layer, a sense layer, and a tunnel barrier to electrically couple the pinned layer to the sense layer, and a control unit to electrically and magnetically couple to each of the plurality of magnetic random access memory devices.

In an embodiment, a system includes a processor, a magnetic random access memory coupled to the processor, the magnetic random access memory including a plurality of magnetic random access memory devices formed on a substrate, each of the plurality of magnetic random access memory devices including a pinned layer having two or more oxide layers embedded in the pinned layer, a sense layer, and a tunnel barrier to electrically couple the pinned layer to the sense layer, and a control unit formed on the substrate to electrically and magnetically couple to each of the plurality of magnetic random access memory devices.

In an embodiment, a method for forming a magnetic random access memory device includes forming a pinned layer having a diffusion barrier, forming a tunnel barrier on the pinned layer, forming a sense layer on the tunnel barrier. The structure is then annealed.

In an embodiment, a method for forming a magnetic random access memory device includes forming a sense layer, forming a tunnel barrier on the sense layer, forming a pinned layer having a diffusion barrier, the pinned layer formed on the tunnel barrier. The structure is then annealed.

In an embodiment, a method for forming a magnetic random access memory device includes forming a pinned layer having a diffusion barrier, forming a tunnel barrier on the pinned layer, and forming a sense layer on the tunnel barrier. The structure is then annealed at a temperature of between about 200 degrees centigrade and about 250 degrees centigrade.

In an embodiment, a method for forming a magnetic random access memory device includes forming a nickel-iron layer, forming an aluminum oxide layer on the nickel-iron layer, forming a cobalt-iron layer on the aluminum oxide layer, forming a conductive layer on the cobalt-iron layer, forming a cobalt-iron layer on the conductive layer, forming a diffusion barrier on the cobalt iron layer, forming a cobalt-iron layer on the diffusion barrier, and forming a iridium-manganese layer on the cobalt-iron layer.

These and other embodiments, aspects, advantages and features of the present invention will be set forth in part in the description which follows, and in part will become apparent to those skilled in the art by reference to the following description of the invention and referenced drawings or by practice of the invention. The aspects, advantages and features of the invention are realized and attained by means of the instrumentalities, procedures and combinations particularly pointed out in the appended claims.

DETAILED DESCRIPTION

In the following detailed description of the described embodiments, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present invention is defined only by the appended claims.

The term substrate used in the following description include any structure having an exposed surface with which to form the structure of the present invention. The term substrate is understood to include semiconductor wafers. The term substrate is also used to refer to device structures during processing, and may include other layers that have been fabricated thereupon. The term substrate includes doped and undoped semiconductors, epitaxial semiconductor layers supported by a base semiconductor or insulator, as well as other device structures well known to one skilled in the art. The term conductor is understood to include semiconductors, and the term insulator or dielectric is defined to include any material that is less electrically conductive than the materials referred to as conductors.

The term "horizontal" as used in this application is defined as a plane parallel to the conventional plane or surface of a substrate, regardless of the orientation of the substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the substrate, regardless of the orientation of the substrate. The following detailed description is, therefore, not to be taken in a limiting sense, and the scope of the present invention is defined only by the appended claims, along with the full scope of equivalents to which such claims are entitled.

Figure 1:
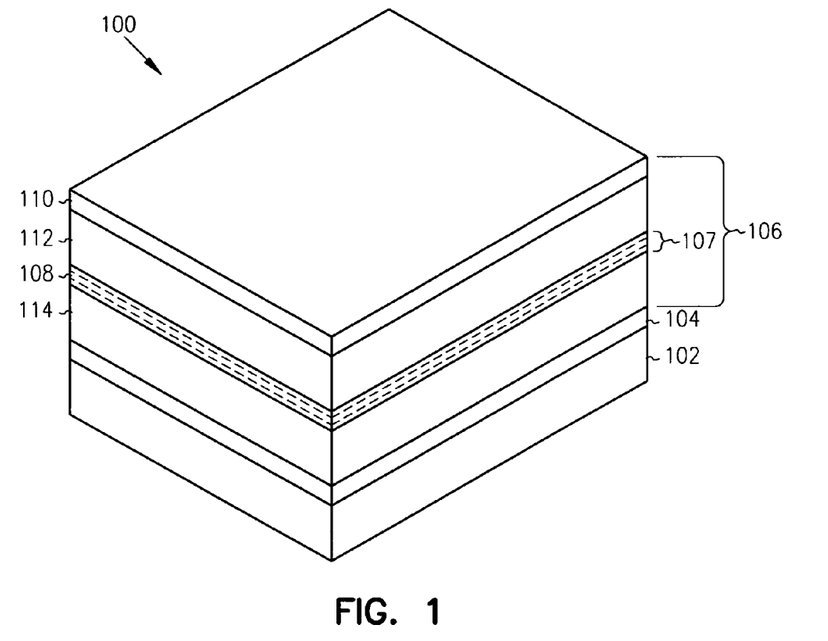
FIG. 1 is an illustration of a magnetic random access memory device including a sense layer, a tunnel barrier, and a pinned layer having a diffusion barrier, in accordance with an embodiment of the present invention.

FIG. 1 is an illustration of a magnetic random access memory device 100 including a sense layer 102, a tunnel barrier 104, and a pinned layer 106 having a diffusion barrier 108, in accordance with an embodiment of the present invention. The tunnel barrier 104 is adapted to electrically couple the pinned layer 106 to the sense layer 102. The pinned layer 106 includes an antiferromagnetic layer 110, a ferromagnetic layer 112, and a ferromagnetic layer 114 with diffusion barrier 108 between ferromagnetic layers 112, 114. Diffusion barrier 108 prevents diffusion of non-magnetic material in the pinned layer 106 to the tunnel barrier 104 during heat treatments that would reduce or destroy the tunneling magnetoresistive (TMR) properties of the magnetic random access memory device 100.

Pinned layer 106 has a magnetization that is oriented in a plane, but fixed such that the magnetization does not rotate in the presence of an applied magnetic field. Free layer 102 ha a magnetization that is not pinned, so that its magnetization can be rotated in the presence of an applied magnetic field. If the magnetization of free layer 102 and pinned layer 106 are in the same direction, the orientation is considered parallel. If the magnetization of free layer 102 and pinned layer 106 are in opposite directions, the orientation is considered anti-parallel.

Tunnel barrier 104 separates free layer 102 and pinned layer 106. Tunnel barrier 104 allows quantum mechanical tunneling to occur between free layer 102 and pinned layer 106. This device structure then can provide for a tunneling magnetoresistance having two separate states or values. If the orientation of free layer 102 and pinned layer 106 is anti-parallel, the magnetoresistance is significantly larger than the magnetoresistance if the orientation of free layer 102 and pinned layer 106 is parallel. This TMR property forms the basis for the use of the structure of FIG. 1 in memory devices.

Figure 2:
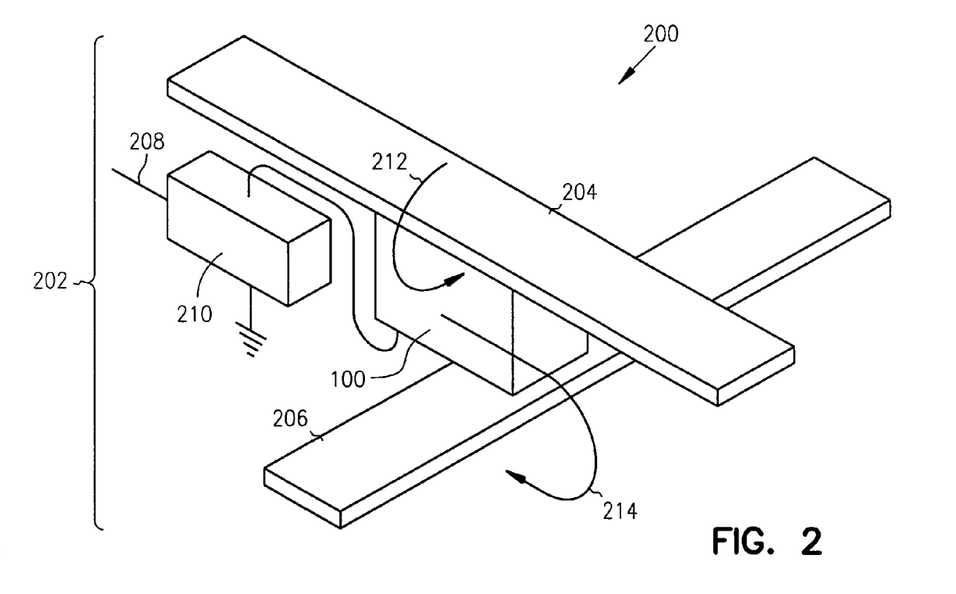
FIG. 2 is an illustration of a magnetic memory device including the magnetic random access memory device, which is illustrated in FIG. 1, and a control unit, in accordance with an embodiment of the present invention.

FIG. 2 is an illustration of a magnetic memory device 200 including the magnetic random access memory device 100, which is illustrated in FIG. 1, and a control unit 202 in accordance with an embodiment of the present invention. The control unit 202 includes a bit line 204, a digit line 206, a word line 208 and a control switch 210. The bit line 204 is in electrical contact with the magnetic random access memory device 100. The digit line 206 is aligned substantially perpendicular to the bit line 204 and is slightly separated from the magnetic random access memory device 100. The word line 208 is coupled to the control switch 210 that is electrically coupled to the magnetic random access memory device 100 to control the flow of current in the magnetic random access memory device 100.

In operation, the magnetic memory device 200 includes a "write" mode to store information and a "read" mode to retrieve stored information. In the "write" mode, the control switch 210 is open, and current is provided to the bit line 204 and the digit line 206. The magnetic fields 212 and 214 produced by the currents in the bit line 204 and the digit line 206, respectively, set the magnetization of the sense layer 102 (shown in FIG. 1). If the magnetization of the sense layer 102 (shown in FIG. 1) is set parallel to the magnetization of the pinned layer 106 (shown in FIG. 1), then in the "read" mode during a "read" operation, with the control switch 210 turned "on" by the word line 208, the magnetic random access memory device 100 has a small resistance and a small voltage drop at the magnetic random access memory device 100 that can be detected by sense circuits (not shown). If the magnetization of the sense layer 102 (shown in FIG. 1) is set anti-parallel to the magnetization of the pinned layer 106, then in the "read" mode during a "read" operation, with the control switch turned "on" by the word line 208, the magnetic random access memory device 100 has a large resistance and a large voltage drop at the magnetic random access memory device 100 that can be detected by sense circuits (not shown). The terms large and small used in reference to the resistance of the tunnel barrier 100 are relative terms only and are not intended to convey any indication of an absolute magnitude of resistance.

Figure 3:
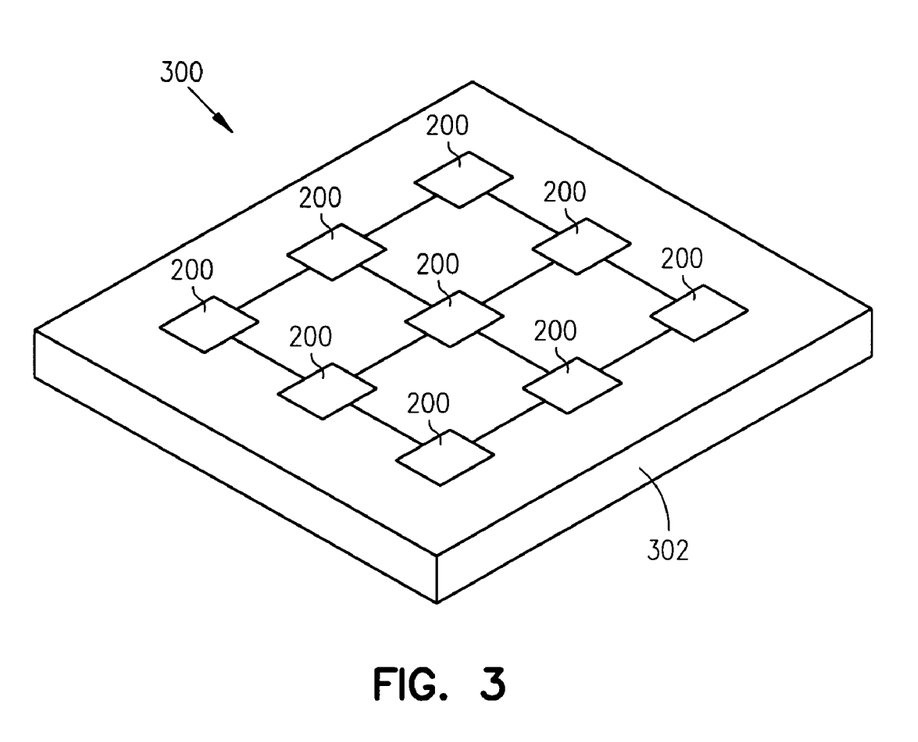
FIG. 3 is an illustration of a magnetic memory including a plurality of magnetic memory devices, one of which is illustrated in FIG. 2, formed on a substrate, in accordance with an embodiment of the present invention.

FIG. 3 is an illustration of a magnetic memory 300 including a plurality of magnetic memory devices 200, one of which is illustrated in FIG. 2, formed on a substrate 302 in accordance with an embodiment of the present invention. Each of the plurality of magnetic memory devices 300 includes the magnetic random access memory device 100 (shown in FIG. 1). The operation of the magnetic memory 300 is controlled by signals (not shown) that drive the bit line 204 (shown in FIG. 2), the digit line 206 (shown in FIG. 2) and the word line 208 (shown in FIG. 2). The substrate 302 is not limited to being fabricated from a particular material. Exemplary substrate materials suitable for use in connection with the fabrication of the magnetic memory 300 include silicon, germanium, germanium-silicon, zinc selenide, gallium arsenide and silicon-on-insulator.

Figure 4:
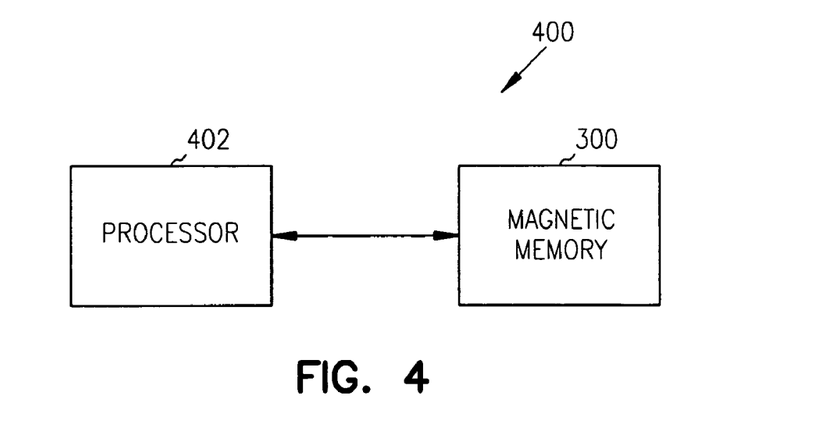
FIG. 4 is a block diagram of a system including a processor communicatively coupled to the magnetic memory, which is illustrated in FIG. 3, in accordance with an embodiment of the present invention.

FIG. 4 is a block diagram of a system 400 including a processor 402 communicatively coupled to the magnetic memory 300, which is illustrated in FIG. 3, in accordance with an embodiment of the present invention. The processor 402 is not limited to a particular type of processor. Exemplary processors suitable for use in connection with the system 400 include reduced instruction set processors, complex instruction set processors and very long instruction word processors. The processor 402 is not limited to being "hard wired" to the magnetic memory 300. For example, the processor 402 can be communicatively coupled to the magnetic memory 300 through a wireless communication connection, such as a radio frequency communication connection or an infrared communication connection. The system 400 is also not limited to use in connection with a particular type of application. Exemplary applications in which the system 400 can be used include a desktop computer system, a server computer system, an automobile control system, and a personal communication or computing system, such as a device phone, a personal digital assistant, a laptop computer, or a tablet computer.

Devices and systems of FIGS. 2–4 illustrate the application of a magnetic random access memory device that includes a pinned layer having a diffusion barrier according to various embodiments of the present invention. In various embodiments, these devices and system use a pinned layer 106 that includes a multilayer structure to enhance the application of the TMR property, where a barrier layer is provided to block the diffusion of non-magnetic atoms to the tunnel barrier that would reduce or eliminate the TMR properties of the device.

FIG. 1 illustrates some features of a magnetic random access memory device for various embodiments of the present invention. The sense layer 102 includes a ferromagnetic material. In an embodiment, the ferromagnetic material is a material that has a low coercivity and therefore requires only a small magnetic field to change the direction of the magnetization. The sense layer 102 is not limited to being fabricated using a particular ferromagnetic material. Exemplary ferromagnetic materials suitable for use in connection with the sense layer 102 include nickel-iron alloys. The sense layer 102 can be formed on a substrate (not shown) by depositing or sputtering a ferromagnetic material, such as a nickel-iron alloy, on the substrate.

The tunnel barrier 104 includes an insulator. The tunnel barrier 104 selectively controls the tunneling of electrons from the pinned layer 106 to the sense layer 102. The tunnel barrier 104 is not limited to being fabricated from a particular material or class of materials. In an embodiment, the tunnel barrier 104 includes an aluminum oxide layer. The tunnel barrier 104 can be formed on the sense layer 102 by plasma oxidation of an aluminum layer sputtered, evaporated, or deposited by physical vapor deposition on the sense layer 102.

The pinned layer 106, in an embodiment, includes an antiferromagnetic layer 110, a ferromagnetic layer 112, and a ferromagnetic layer 114. In an embodiment, an antiferromagnetic layer has a small but positive susceptibility. Neither the ferromagnetic layer 112 nor the ferromagnetic layer 114 are limited to a particular ferromagnetic material. The materials and their thicknesses selected for the antiferromagnetic layer 110, the ferromagnetic layer 112, and the ferromagnetic layer 114 are chosen such that an exchange coupling between the anti ferromagnetic layer 110 and the ferromagnetic layers of the pinned layer 106 provides the pinning for pinned layer 106.

The pinning shifts a hysteresis loop by several hundred oersteds due to antiferromagnetic exchange between antiferromagnetic layer 110, which has no magnetic moment, and the ferromagnetic layers of pinned layer 106. This exchange bias effect is an interface effect. With antiferromagnetic layer 110 at one end of the pinned layer 106 (on top of the ferromagnetic layers 112, 114 of the embodiment in FIG. 1), the hysteresis loop of the pinned layer 106 is shifted several hundred oersteds, while sense layer 102 is around zero field.

As a result of the pinning effect, the magnetic orientation of the pinned layer 106 is maintained during operation of the MRAM 100. The initial setting for the magnetic orientation of the pinned layer 106 can be provided by annealing the MRAM in the presence of a magnetic field. In addition, to setting the magnetic orientation of the pinned layer 106, this annealing can provide improvement in anisotropic dispersion of the sense layer 102. Further, annealing can improve the tunneling magnetoresistance of the MRAM 100 as a result of oxygen drifting from the ferromagnetic layers into tunnel barrier 104.

Diffusion barrier 108 of pinned layer 106 provides a means to block atomic diffusion of non-magnetic material from the antiferromagnetic layer 110 to the tunnel barrier during annealing or during other procedures at elevated temperatures. Such diffusion would adversely reduce or destroy the TMR of MRAM 100. Additionally, diffusion barrier 108 has a thickness that does not adversely affect the exchange coupling between the antiferromagnetic layer and the ferromagnetic layers of pinned layer 106. Depending on the materials selected for antiferromagnetic layer 110 and ferromagnetic layers 112, 114, diffusion barrier 108 can range from one or two monolayers to several angstroms thick.

In an embodiment, magnetic random access memory device 100 includes the antiferromagnetic layer 110 using an iridium-manganese alloy where the diffusion barrier 108 blocks the diffusion of the manganese atoms from the antiferromagnetic layer 110 to an $AlO_x$ tunnel barrier 104 during annealing. Manganese from IrMn anti-ferromagnetic layer 110 used to set the pinned layer 106 is highly mobile in the ferromagnetic layers 112, 114 and immobile in the $AlO_x$ tunnel barrier 104. Without diffusion barrier 108, this difference in mobility tends to cause Mn to accumulate ate the $AlO_x$ tunnel barrier 104/pinned layer 106 interface. Because TMR is strongly interface dependent, the accumulation would destroy the TMR properties at relatively low Mn concentrations. Thus, Mn diffusion can restrict the time and temperature range over which MRAM stacks can be annealed. Reducing time and temperature processing parameters minimizes the effectiveness of a annealing procedure to set the magnetization of the pinned layer 106. Further, the thermal limit imposed by Mn diffusion would limit overall device/system processing temperatures making MRAM processing difficult. However, structures using diffusion barrier 108 overcome these limitations by blocking the thermal migration of manganese atoms.

The diffusion barrier 108 can include one or more materials that block the diffusion of atoms, but the diffusion barrier 108 is not limited to being formed from a particular material. In an embodiment, the diffusion barrier 108 includes a nano-oxide layer (NOL), i.e., an oxide layer having a thickness in the nanometer range from a monolayer to less than about 20 angstroms. The use of a NOL as diffusion barrier 108 inhibits the diffusion of Mn to tunnel barrier 104 without strongly degrading the pinning field in pinned layer 106 or strongly increasing the resistance of the structure due to a thin oxide in the direction of current flow. Diffusion barrier 108 thus permits an MRAM stack to undergo magnetic annealing at higher temperatures and also to loosen the processing temperature limits of the device and/or system in which the MRAM stack is fabricated. In an embodiment, the diffusion barrier 108 includes a native oxide layer having a thickness of between a monolayer and about seven angstroms. In another embodiment, the diffusion barrier 108 includes an aluminum oxide film. In embodiment, the diffusion barrier 108 includes a film of aluminum oxide having a thickness of between a monolayer and about seven angstroms. In another embodiment, the diffusion barrier 108 includes two or more separated diffusion barriers formed between the ferromagnetic layer 112 and the ferromagnetic layer 114. In still another embodiment, the diffusion barrier 108 includes two or more separated oxide layers embedded in the pinned layer 106.

In an embodiment, diffusion barrier 108 is any material that has a strong enough affinity to Mn that it inhibits the migration of Mn to the tunnel barrier 104. For example, a 'synthetic antiferromagnetic' pinned layer using a 7 angstrom layer of ruthenium provides some resistance to Mn diffusion as evidenced by improved thermal stability during annealing compared to a device with no ruthenium layer. In another embodiment, a laminate of several thin Ru layers 107 are used to provide a diffusion barrier, where each Ru layer is formed with a thin thickness such that coupling is ferromagnetic rather than antiferromagnetic.

The diffusion barrier 108 can be formed by deposition processes, such as sputtering or physical vapor deposition, an oxidation process or a combination of deposition processes and oxidation processes. In an embodiment, a metal layer is deposited and a native oxide of the metal is formed on the magnetic material 114 by an oxidation process. A oxide layer is formed on the ferromagnetic layer 114 by deposition of the desired material to the desired thickness. In an embodiment, a thin film of aluminum oxide is formed on the ferromagnetic layer 114 by deposition of aluminum to the desired thickness. In an embodiment, a thin film of aluminum having an oxidized surface is formed on the magnetic material 114 by deposition of aluminum to the desired thickness followed by oxidation of the deposited aluminum.

The pinned layer 106 is not limited to use in connection with a particular antiferromagnetic material, a particular ferromagnetic materials or a particular non-magnetic material. In an embodiment, pinned layer 106 includes a laminate structure formed from a plurality of layers of one or more materials. In an embodiment, pinned layer 106 includes a plurality of layers having a ruthenium layer. One such embodiment includes a so-called synthetic antiferromagnet with ruthenium that is augmented with diffusion barrier 108.

Exemplary antiferromagnetic materials suitable for use in connection with the fabrication of the pinned layer 106 include manganese alloys such as IrMn, PdMn, FeMn, etc.

Exemplary ferromagnetic materials suitable for use in connection within the pinned layer 106 include cobalt-iron alloys, nickel-iron alloys, cobalt-platinum alloys, cobalt-zirconium-platinum alloys, cobalt-niobium alloys, cobalt-zirconium-niobium alloys, iron alloys, iron-aluminum alloys, iron-tantalum alloys, iron-zirconium alloys and iron-aluminum-silicon alloys. Exemplary non-magnetic materials suitable for use within pinned layer 106 include ruthenium alloys, copper alloys, gold alloys, and silver alloys. The ferromagnetic layers 112,114 can be formed by the sputtering or physical vapor deposition. Also, the antiferromagnetic layer 110 and the non-magnetic materials used in various embodiments can be formed by sputtering or physical vapor deposition.

Figure 5A:
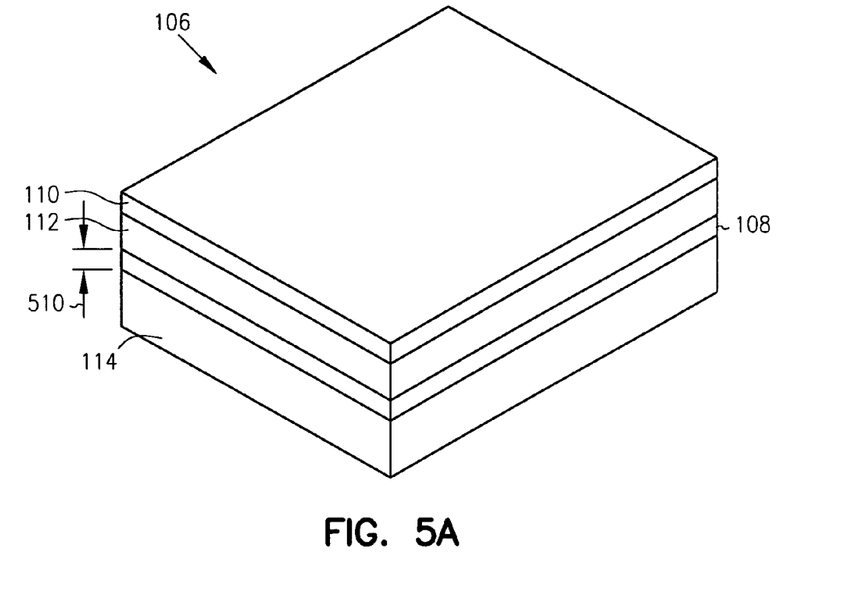
FIG. 5A shows a native oxide layer embedded in the pinned layer illustrated in FIG. 1, in accordance with an embodiment of the present invention.
Figure 5B:
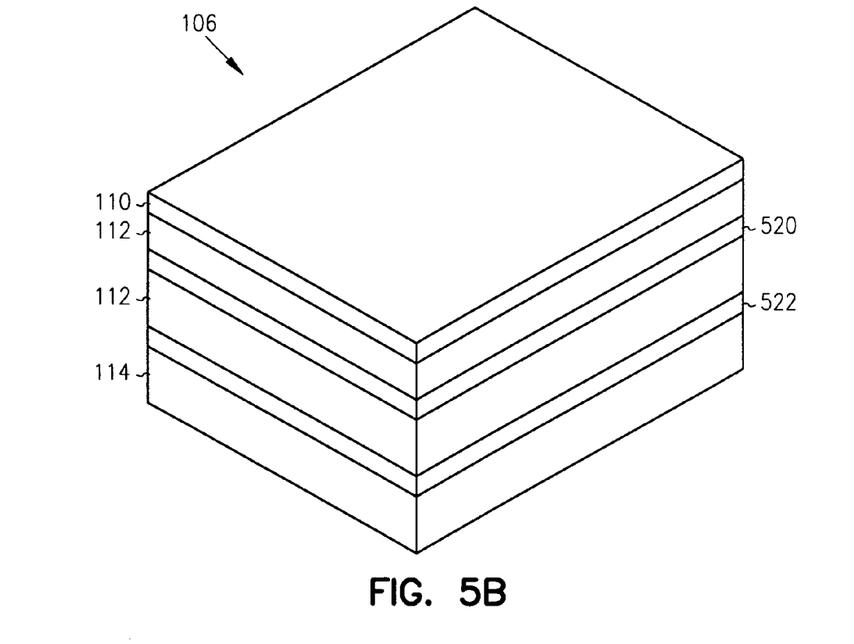
FIG. 5B shows two oxide layers embedded in the pinned layer illustrated in FIG. 1, in accordance with still another embodiment of the present invention.

FIGS. 5A, 5B show the pinned layer 106 illustrated in FIG. 1 having a thickness 510 in accordance with various embodiments of the present invention. The pinned layer 106 illustrated in each of the FIGS. 5A, 5B includes antiferromagnetic layer 110 and ferromagnetic layers 112, 114. In an embodiment, diffusion barrier 108 is a nano-oxide layer. In an embodiment, diffusion barrier 108 includes a thin film of aluminum oxide having a thickness 510 of between a monolayer and about seven angstroms embedded in pinned layer 106. In another embodiment, diffusion barrier 108 includes a native oxide having a thickness 510 of between a monolayer and about seven angstroms embedded in pinned layer 106. FIG. 5B shows two oxide layers 520 and 522 embedded in pinned layer 106 in accordance with an embodiment of the present invention.

Figure 6:
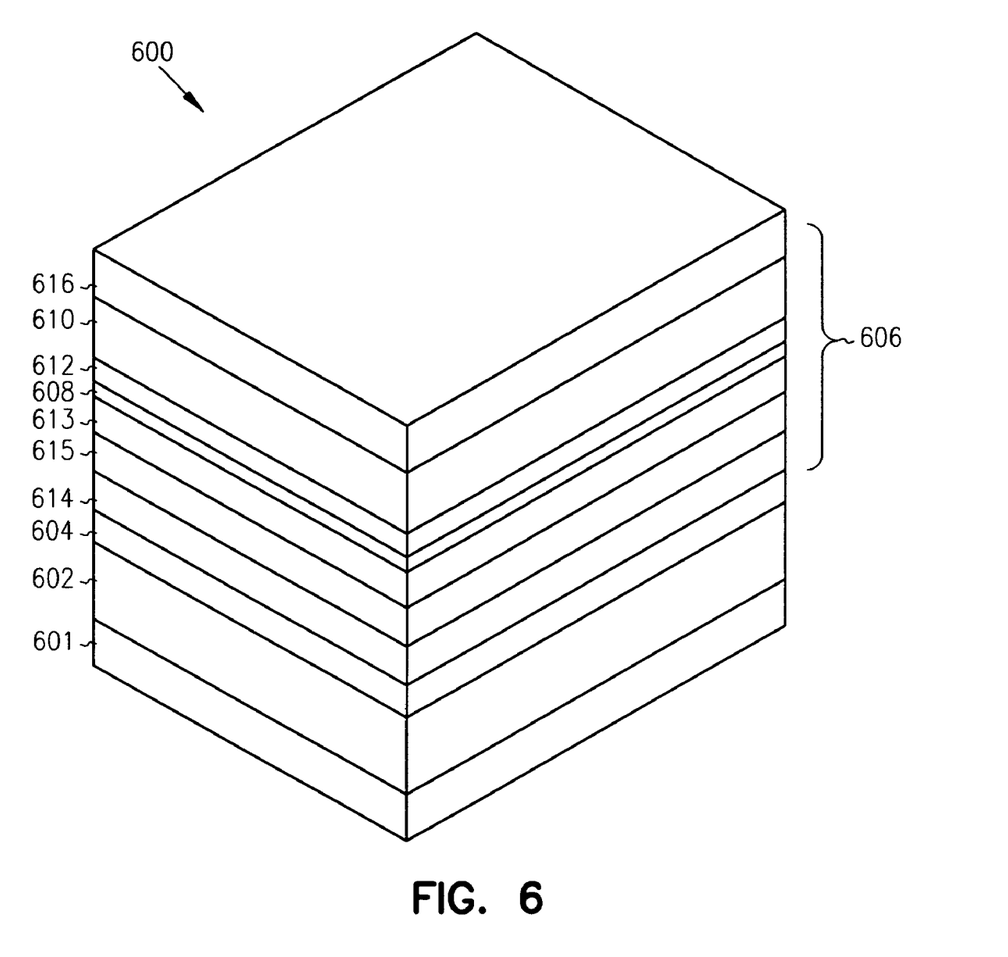
FIG. 6 depicts an embodiment of a magnetic access memory device including a sense layer, a tunnel barrier, and a multilayer pinned layer, the pinned layer having a diffusion barrier, in accordance with the present invention.

FIG. 6 shows an embodiment of a MRAM 600 in accordance with the present invention. MRAM 600 includes a contact layer 601, a sense layer 602, a tunnel barrier 604, a pinned layer 606, and a contact layer 616. The pinned layer 606 includes ferromagnetic layer 614, conductive layer 615, ferromagnetic layer 613, diffusion barrier 608, ferromagnetic layer 612, and antiferromagnetic layer 610.

Antiferromagnetic layer 610 includes a manganese compound, e.g., IrMn, PdMn, FeMn, or other antiferromagnetic compound containing manganese. Sense layer 603 and the ferromagnetic layers 612–614 include ferromagnetic material as previously discussed herein. In one embodiment, sense layer 602 contains a nickel iron alloy, and the ferromagnetic layers 612–614 contain a cobalt iron alloy. Diffusion barrier 608 includes a nano-oxide layer. In an embodiment, diffusion barrier 608 includes $AlO_x$ having a thickness from about a monolayer to about seven angstroms. Conductive layer 615, in an embodiment, is a metallic layer such as copper, ruthenium, gold alloys, or silver alloys. Further, contact layers 601, 616 act as caps of conductive material. In an embodiment, contact layers 601, 616 include Ta layers. Additionally, the MRAM 600 of FIG. 6 is fabricated on a substrate as are other elements to form a device using the TMR properties of the MRAM 600.

A MRAM device having a structure according to various embodiments of the present invention can be formed by a method including forming a sense layer, forming a tunnel barrier on the sense layer, and forming a pinned layer on the tunnel barrier where the pinned layer has a diffusion barrier. In an embodiment of a method for forming a MRAM device, the sense layer is formed on a substrate. An alternative embodiment of method for forming a MRAM device includes forming a pinned layer having a diffusion barrier, forming a tunnel barrier on the pinned layer, and forming a sense layer on the tunnel barrier. In this embodiment of a method for forming a MRAM device, the pinned layer is formed on a substrate.

Figure 7A:
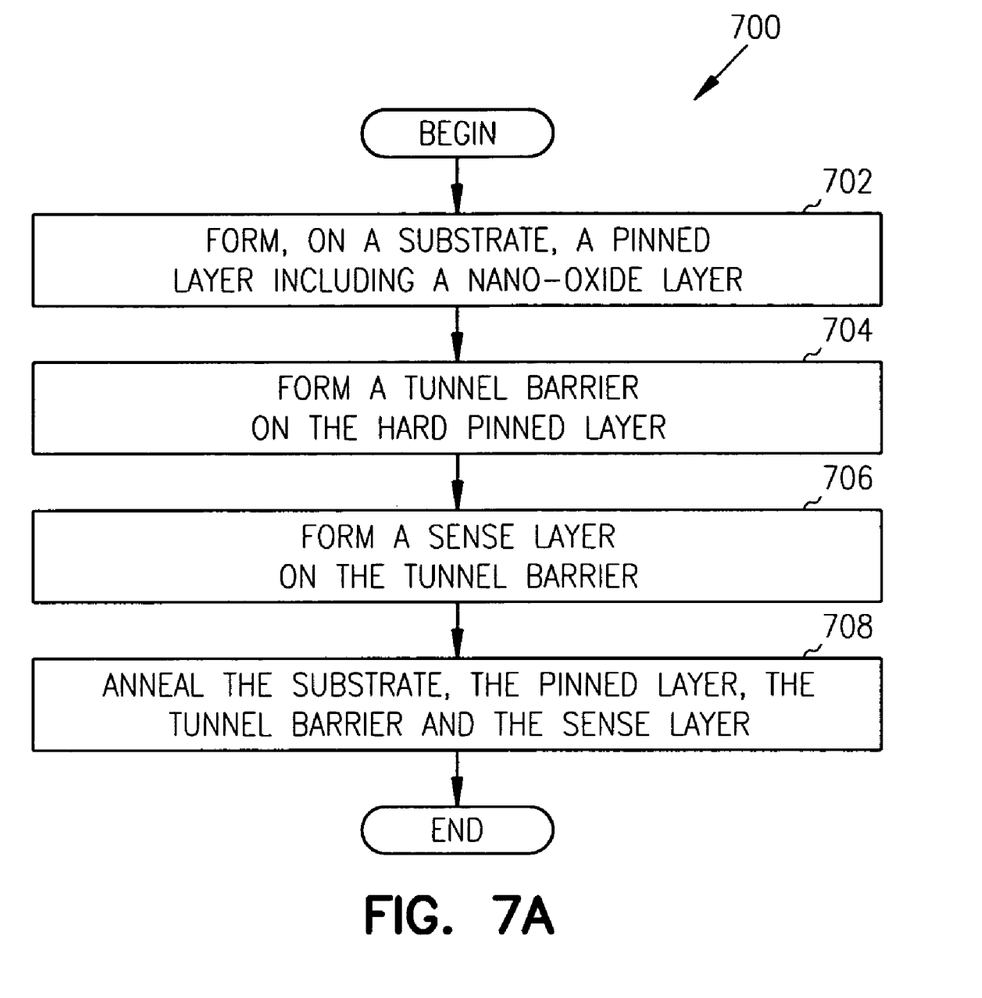
FIGS. 7A–7D show flow diagrams of various embodiments of a method for forming a magnetic random access memory device, in accordance with the present invention.

FIG. 7A shows a flow diagram of an embodiment of a method 700 for forming a magnetic random access memory device, in accordance with the present invention. The method 700 includes forming, on a substrate, a pinned layer including a nano-oxide layer (block 702), forming a tunnel barrier on the pinned layer (block 704), forming a sense layer on the tunnel barrier (block 706), and annealing the substrate, the pinned layer, the tunnel barrier and the sense layer (block 708). The embodiment of FIG. 7A provides a method that forms the pinned layer on the bottom of the magnetic random access memory device. In another embodiment, a method forms the pinned layer on the top and the sensed layer on the bottom of the magnetic random access memory device. In another embodiment, a method includes forming a pinned layer including a native oxide at block 702.

Figure 7B:
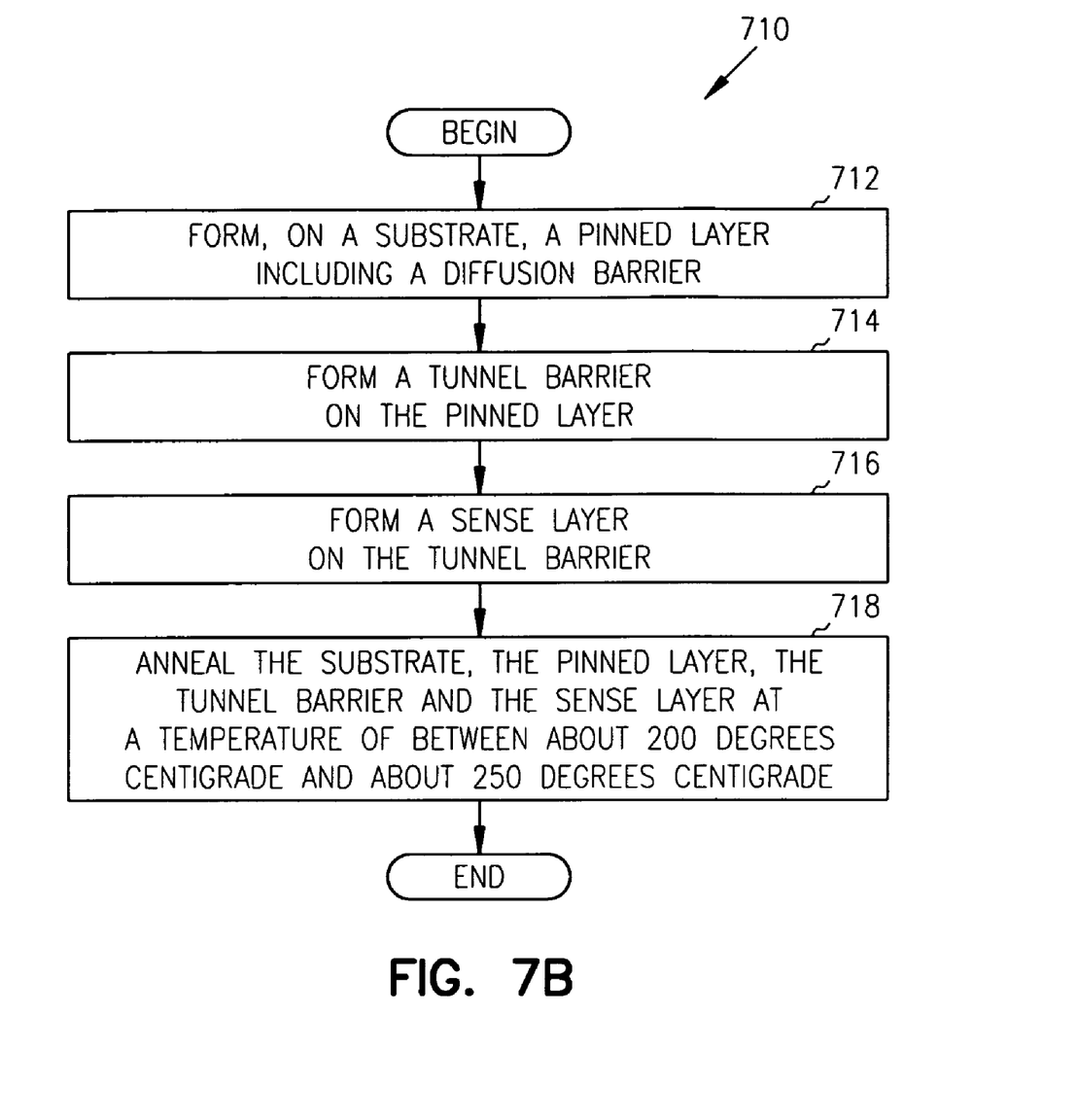

FIG. 7B shows a flow diagram of another embodiment of a method 710 for forming a magnetic random access memory device, in accordance with the present invention. The method 710 includes forming, on a substrate, a pinned layer having a diffusion barrier (block 712), forming a tunnel barrier on the pinned layer (block 714), forming a sense layer on the tunnel barrier (block 716), and annealing the substrate, the pinned layer, the tunnel barrier and the sense layer at a temperature of between about 200 degrees centigrade and about 250 degrees centigrade (block 718). The embodiment of FIG. 7B provides a method that forms the pinned layer on the bottom of the magnetic random access memory device. In another embodiment, a method forms the pinned layer on the top and the sensed layer on the bottom of the magnetic random access memory device. In an embodiment, forming a pinned layer having a diffusion barrier includes forming an oxide layer. In an embodiment, forming a pinned layer having a diffusion barrier includes forming an native oxide layer. In an embodiment, forming a pinned layer having a diffusion barrier includes forming a nano-oxide layer.

Figure 7C:
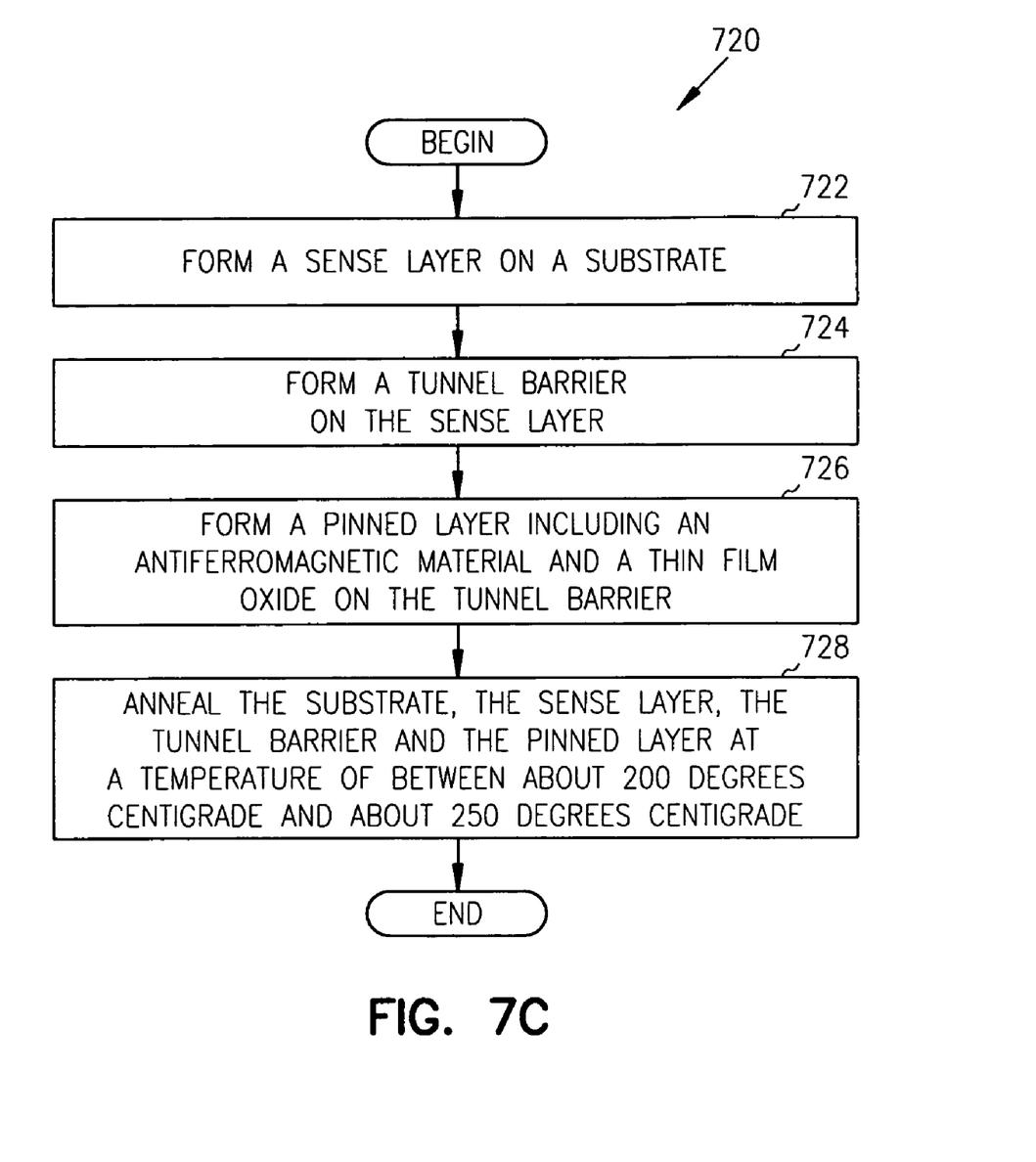

FIG. 7C shows a flow diagram of another embodiment of a method 720 for forming a magnetic random access memory device, in accordance with the present invention. The method 720 includes forming a sense layer on a substrate (block 722), forming a tunnel barrier on the sense layer (block 724), forming a pinned layer including an antiferromagnetic material and a thin film oxide layer on the tunnel barrier (block 726), and annealing the substrate, the sense layer, the tunnel barrier and the pinned layer at a temperature of between about 200 degrees centigrade and about 250 degrees centigrade (block 728). In an embodiment, forming a pinned layer including an antiferromagnetic material and a thin film oxide layer includes forming an native oxide layer. In an embodiment, forming a pinned layer including an antiferromagnetic material and a thin film oxide layer includes forming a nano-oxide layer.

Figure 7D:
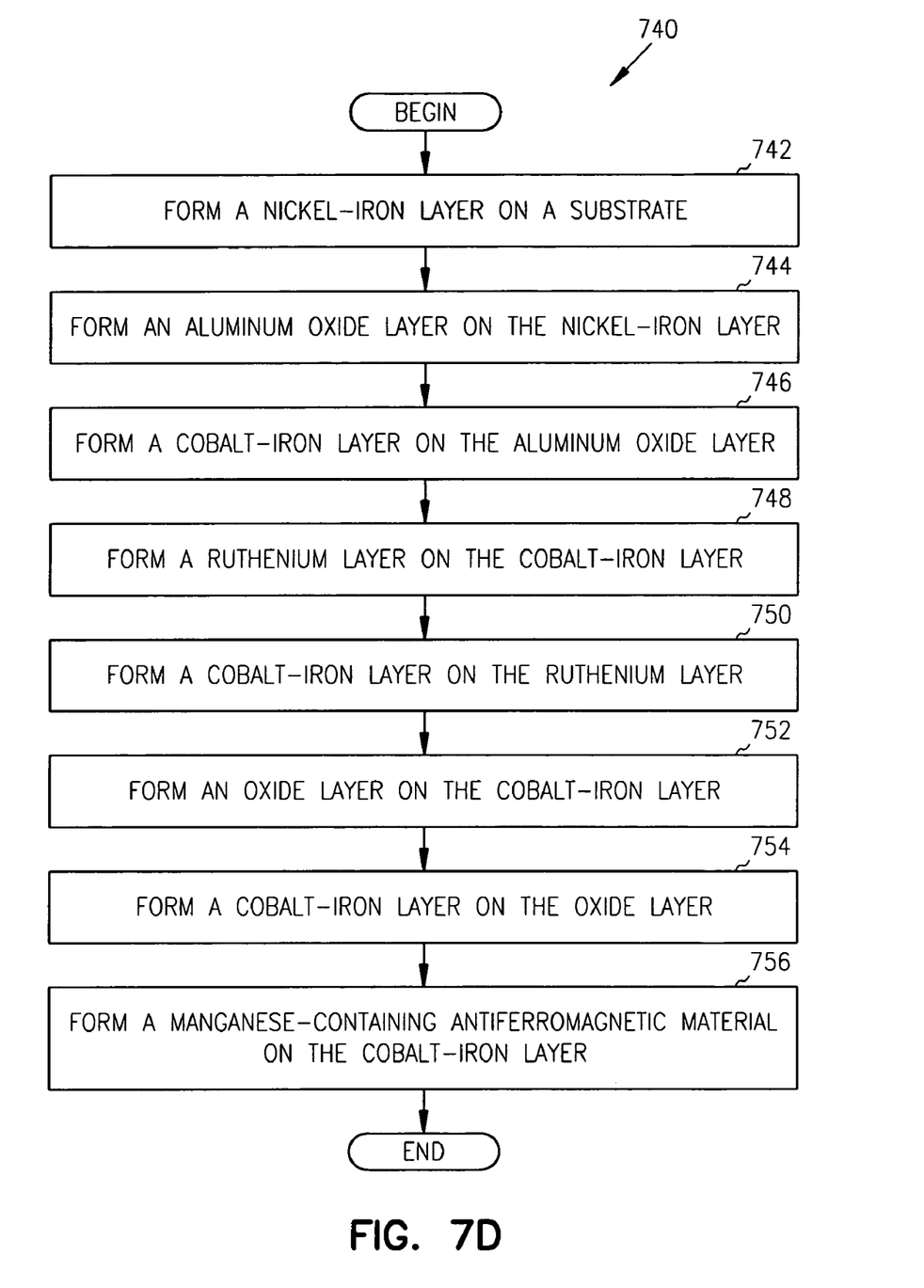

FIG. 7D shows a flow diagram of another embodiment of a method 740 for forming a magnetic random access memory device, in accordance with the present invention. The method 740 includes forming a nickel-iron layer on a substrate (block 742), forming an aluminum oxide layer on the nickel-iron layer (block 744), forming a cobalt-iron layer on the aluminum oxide layer (block 746), forming a ruthenium layer on the cobalt-iron layer (block 748), forming a cobalt-iron layer on the ruthenium layer (block 750), forming an oxide layer on the cobalt iron layer (block 752), forming a cobalt-iron layer on the oxide layer (block 754), and forming a manganese-containing antiferromagnetic material on the cobalt-iron layer (block 756).

Forming a nickel-iron layer (block 742) forms a sense layer, and forming an aluminum oxide layer on the nickel-iron layer (744) forms a tunnel barrier. Further, forming a cobalt-iron layer on the aluminum oxide layer (block 746), forming a ruthenium layer on the cobalt-iron layer (block 748), forming a cobalt-iron layer on the ruthenium layer (block 750), forming an oxide layer on the cobalt iron layer (block 752), forming a cobalt-iron layer on the oxide layer (block 754), and forming a manganese-containing antiferromagnetic material on the cobalt-iron layer (block 756) forms a so-called "synthetic antiferromagnet" with ruthenium that is augmented with a diffusion barrier, which is the oxide layer. In an embodiment, the manganese-containing antiferromagnetic material contains IrMn. In another embodiment, the manganese-containing antiferromagnetic material contains material selected from a group consisting of FeMn, NiMn, PtMn. In addition, in an alternative embodiment, forming a ruthenium layer on the cobalt-iron layer (block 748) can be replaced with forming a copper layer. Further, in an embodiment, forming an oxide layer on the cobalt iron layer (block 752) includes forming a nano-oxide layer on the cobalt iron layer. Further, in an embodiment, forming an oxide layer on the cobalt iron layer (block 752) includes forming a native oxide layer on the cobalt iron layer. Further, in an embodiment, forming an oxide layer on the cobalt iron layer (block 752) includes forming an $AlO_x$ layer on the cobalt iron layer, the $AlO_x$ layer having a thickness ranging from a monolayer to about seven angstroms.

In embodiments of various methods illustrated in FIGS. 7A–7D, annealing is used to heat the magnetic tunnel junction to set the antiferromagnet of the MRAM structure and improve the tunnel barrier and the sharpness of its interfaces with ferromagnetics of the MRAM structure. Although a variety of processes can be employed to form the materials included in the methods shown in flow diagrams of FIGS. 7A–7D, each material can be formed by a sputtering. For oxide materials within the structure the materials can be formed using a variety of oxidation processes. In an embodiment, the oxidation processes can be performed in an argon-oxygen plasma environment.

CONCLUSION

Magnetic random access memory devices are often annealed in the presence of a magnetic field to improve the sense layer magnetic characteristics and to improve the devices tunneling magnetoresistive properties. The range of annealing times and annealing temperatures is expanded by forming the magnetic random access memory device with a pinned layer having a diffusion barrier. The diffusion barriers blocks the migration of non-magnetic material from an antiferromagnetic layer in the pinned layer to a tunnel barrier separating the pinned layer from the sensing layer.

Such a diffusion barrier blocks the diffusion of manganese from an antiferromagnetic layer in the pinned layer to the tunnel barrier. The diffusion barrier can be a nano-oxide layer. Additionally, the diffusion barrier can be a native oxide having a thickness up to about seven angstroms or an aluminum oxide having a thickness up to about seven angstroms. Alternatively, the diffusion barrier may be any material that has a strong enough affinity to Mn that it inhibits the migration of Mn to the tunnel barrier and does not destroy exchange coupling in the pinned layer, such as to provide a barrier to Mn diffusion. A "synthetic antiferromagnetic" pinned layer using a 7 Å layer of ruthenium provides resistance to Mn diffusion. Also, a laminate of several thin Ru layers may be used to provide a diffusion barrier, where each Ru layer is formed with a thin thickness such that coupling is ferromagnetic rather than antiferromagnetic. The use of a diffusion barrier inhibits the diffusion of Mn to the tunnel barrier without strongly degrading the pinning field in the pinned layer or strongly increasing the resistance of the structure due to a thin oxide in the direction of current flow. The enhanced operation of the MRAM device using various embodiments for the diffusion barrier included in the pinned layer can be applied to a wide variety of apparatus using memory devices and systems.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A magnetic random access memory device comprising:
   a pinned layer having a diffusion barrier, the diffusion barrier including:
      a first insulative diffusion barrier layer;
      a second diffusion barrier layer; and
      a ferromagnetic layer between and contacting the first insulative diffusion barrier layer and the second diffusion barrier layer;
   a sense layer; and
   a tunnel barrier to electrically couple the pinned layer to the sense layer.

2. The magnetic random access memory device of claim 1, wherein the pinned layer includes an iridium-manganese alloy.

3. The magnetic random access memory device of claim 1, wherein the sense layer includes a nickel-iron alloy.

4. The magnetic random access memory device of claim 1, wherein the first insulative diffusion barrier layer includes a nano-oxide layer.

5. The magnetic random access memory device of claim 1, wherein the first insulative diffusion barrier layer includes a native oxide layer having a thickness ranging from about a monolayer to about seven angstroms.

6. The magnetic random access memory device of claim 1, wherein the second diffusion barrier layer includes a laminate of Ru layers, each Ru layer having a thickness such that its coupling in the pinned layer is ferromagnetic.

7. The magnetic random access memory device of claim 1, wherein the pinned layer having a diffusion barrier includes a synthetic antiferromagnet with ruthenium augmented with the diffusion barrier.

8. A magnetic random access memory device comprising:
   a pinned layer including a diffusion barrier, the diffusion barrier including:
      a thin film of aluminum oxide having a thickness of between a monolayer and about seven angstroms;
      a second diffusion barrier layer; and
      a ferromagnetic layer between and contacting the thin film of aluminum oxide and the second diffusion barrier layer;
   a sense layer; and
   a tunnel barrier to electrically couple the pinned layer to the sense layer.

9. The magnetic random access memory device of claim 8, wherein the pinned layer includes an antiferromagnet layer and a pinned ferromagnetic layer.

10. The magnetic random access memory device of claim 8, wherein the pinned layer includes an antiferromagnetic material containing manganese.

11. The magnetic random access memory device of claim 8, wherein the pinned layer includes a synthetic antiferromagnet with ruthenium augmented with the diffusion barrier.

12. A magnetic random access memory device comprising:
   a pinned layer including a diffusion barrier, the diffusion barrier including:
      a thin film of aluminum oxide;
      a second diffusion barrier layer; and
      a ferromagnetic layer between and contacting the thin film of aluminum oxide and the second diffusion barrier layer;
   a sense layer;
   a tunnel barrier to electrically couple the pinned layer to the sense layer; and
   a control unit to electrically and magnetically couple to the sense layer.

13. The magnetic random access memory device of claim 12, wherein the pinned layer includes an antiferromagnetic material containing manganese.

14. The magnetic random access memory device of claim 13, wherein the thin film of aluminum oxide has a thickness ranging from about a monolayer to about seven angstroms.

15. The magnetic random access memory device of claim 12, wherein the sense layer includes a nickel-iron alloy.

16. The magnetic random access memory device of claim 12, wherein the pinned layer includes a synthetic antiferromagnet with ruthenium augmented with the diffusion barrier.

17. The magnetic random access memory device of claim 12, wherein the pinned layer includes a multilayer structure having a copper layer.

18. A magnetic random access memory comprising:
   a plurality of magnetic random access memory devices formed on a substrate, each of the plurality of magnetic random access memory devices including:
      a pinned layer having a diffusion barrier embedded in the pinned layer, the diffusion barrier including:
         a first insulative diffusion barrier layer;
         a second diffusion barrier layer; and
         a ferromagnetic layer between and contacting the first insulative diffusion barrier layer and the second diffusion barrier layer;
      a sense layer; and
      a tunnel barrier to electrically couple the pinned layer to the sense layer; and
   a control unit to electrically and magnetically couple to each of the plurality of magnetic random access memory devices.

19. The magnetic random access memory of claim 18, wherein the substrate includes silicon.

20. The magnetic random access memory of claim 18, wherein the substrate includes silicon-on-insulator.

21. The magnetic random access memory of claim 18, wherein the first insulative diffusion barrier layer includes an oxide having a thickness ranging from about a monolayer to about seven angstroms.

22. The magnetic random access memory of claim 18, wherein the second diffusion barrier layer includes a nano-oxide layer.

23. The magnetic random access memory of claim 18, wherein the second diffusion barrier layer includes a laminate of Ru layers, each Ru layer having a thickness such that its coupling in the pinned layer is ferromagnetic.

24. A system comprising:
a processor;
a magnetic random access memory coupled to the processor, the magnetic random access memory having:
a plurality of magnetic random access memory devices formed on a substrate, each of the plurality of magnetic random access memory devices including:
a pinned layer including a diffusion barrier embedded in the pinned layer, the diffusion barrier including:
a first insulative diffusion barrier layer;
a second diffusion barrier layer; and
a ferromagnetic layer between and contacting the first insulative diffusion barrier layer and the second diffusion barrier layer;
a sense layer; and
a tunnel barrier to electrically couple the pinned layer to the sense layer; and
a control unit formed on the substrate to electrically and magnetically couple to each of the plurality of magnetic random access memory devices.

25. The system of claim 24, wherein the processor comprises complex instruction set processor.

26. The system of claim 24, wherein the processor comprises a very long instruction word processor.

27. The system of claim 24, wherein the first insulative diffusion barrier layer includes an oxide layer and the second diffusion barrier layer includes a second oxide layer.

28. The system of claim 24, wherein the first insulative diffusion barrier layer includes an oxide layer having a thickness ranging from about a monolayer to about seven angstroms.

29. The system of claim 24, wherein the first insulative diffusion barrier layer includes a nano-oxide layer.

30. The system of claim 24, wherein the second diffusion barrier layer includes a laminate of Ru layers, each Ru layer having a thickness such that its coupling in the pinned layer is ferromagnetic.

31. A method for forming a magnetic random access memory device, the method comprising:
forming a pinned layer having a diffusion barrier on a substrate including forming the diffusion barrier having:
a first insulative diffusion barrier layer;
a second diffusion barrier layer; and
a ferromagnetic layer between and contacting the first insulative diffusion barrier layer and the second diffusion barrier layer;
forming a tunnel barrier on the pinned layer; and
forming a sense layer on the tunnel barrier.

32. The method of claim 31, wherein the method further includes annealing the substrate, the pinned layer, the tunnel barrier and the sense layer.

33. The method of claim 32, wherein annealing the substrate, the pinned layer, the tunnel barrier, and the sense layer includes annealing at a temperature of between about 200 degrees centigrade and about 250 degrees centigrade.

34. The method of claim 31, wherein forming the diffusion barrier includes forming the first insulative diffusion barrier layer as an oxide having a thickness ranging from about a monolayer to about seven angstroms.

35. The method of claim 31, wherein forming the diffusion barrier includes forming the first insulative diffusion barrier layer as a nano-oxide layer.

36. The method of claim 31, wherein forming the diffusion barrier includes forming the second diffusion barrier layer with a laminate of Ru layers, each Ru layer having a thickness such that its coupling in the pinned layer is ferromagnetic.

37. A method for forming a magnetic random access memory device, the method comprising:
forming a sense layer on a substrate;
forming a tunnel barrier on the sense layer; and
forming a pinned layer including a diffusion barrier on the tunnel barrier including forming the diffusion barrier having:
a first insulative diffusion barrier layer;
a second diffusion barrier layer; and
a ferromagnetic layer between and contacting the first insulative diffusion barrier layer and the second diffusion barrier layer.

38. The method of claim 37, wherein the method further includes annealing the substrate, the pinned layer, the tunnel barrier and the sense layer.

39. The method of claim 38, wherein annealing the substrate, the pinned layer, the tunnel barrier, and the sense layer includes annealing at a temperature of between about 200 degrees centigrade and about 250 degrees centigrade.

40. The method of claim 37, wherein forming the diffusion barrier includes forming the first insulative diffusion barrier layer as an oxide having a thickness ranging from about a monolayer to about seven angstroms.

41. The method of claim 37, wherein forming the diffusion barrier includes forming the second diffusion barrier layer as a nano-oxide layer.

42. The method of claim 37, wherein forming the diffusion barrier includes forming the second diffusion barrier layer with a laminate of Ru layers, each Ru layer having a thickness such that its coupling in the pinned layer is ferromagnetic.

43. A method for forming a magnetic random access memory device, the method comprising:
forming a sense layer including forming a nickel-iron layer on a substrate;
forming a tunnel barrier including forming an aluminum oxide layer on the nickel-iron layer;
forming a pinned layer having a diffusion barrier, forming the pinned layer including:
forming a cobalt-iron layer on the aluminum oxide layer;
forming a conductive layer on the cobalt-iron layer;
forming a cobalt-iron layer on the conductive layer;
forming the diffusion barrier on the cobalt iron layer, forming the diffusion barrier including:
forming an oxide layer;
forming a second diffusion barrier layer; and
forming a ferromagnetic layer between and contacting the oxide layer and the second diffusion barrier layer;
forming a cobalt-iron layer on the diffusion barrier; and
forming a manganese-containing antiferromagnetic material on the cobalt-iron layer.

44. The method of claim 43, wherein forming a manganese containing antiferromagnetic material includes forming a layer of IrMn.

45. The method of claim 43, wherein forming a manganese containing antiferromagnetic material includes forming a layer containing material selected from a group consisting of FeMn, NiMn, PtMn.

46. The method of claim 43, wherein the method further includes annealing the magnetic random access memory device.

47. The method of claim 43, wherein forming a conductive layer on the cobalt-iron layer includes forming a ruthenium layer on the cobalt-iron layer.

48. The method of claim 43, wherein forming a conductive layer on the cobalt-iron layer includes forming a copper layer on the cobalt-iron layer.

49. The method of claim 43, wherein forming an oxide layer includes forming a nano-oxide layer.

50. The method of claim 43, wherein forming an oxide layer includes forming a native oxide layer.

51. The method of claim 50, wherein forming a native oxide layer includes forming a native oxide layer having a thickness ranging from about a monolayer to about seven angstroms.

52. The method of claim 43, wherein forming an oxide layer includes forming an aluminum oxide.

53. The method of claim 52, wherein forming an aluminum oxide layer includes forming an aluminum oxide layer having a thickness ranging from about a monolayer to about seven angstroms.

54. A method of forming a magnetic random access memory, the method comprising:
forming a plurality of magnetic random access memory devices on a substrate, each magnetic random access memory devices formed by a method including:
forming a sense layer;
forming a tunnel barrier contacting the sense layer; and
forming a pinned layer having a diffusion barrier, the pinned layer contacting the tunnel barrier, the tunnel barrier separating the sense layer and the pinned layer, including forming the diffusion barrier having:
a first insulative diffusion barrier layer;
a second diffusion barrier layer; and
a ferromagnetic layer between and contacting the first insulative diffusion barrier layer and the second diffusion barrier layer; and
forming a control unit on the substrate to electrically and magnetically couple to each of the plurality of magnetic random access memory devices.

55. The method of claim 54, the method further including annealing the sense layer, the tunnel bamer and the pinned layer.

56. The method of claim 54, wherein forming a sense layer includes forming the sense layer on a substrate.

57. The method of claim 54, wherein forming a pinned layer includes forming the pinned layer on a substrate.

58. The method of claim 54, wherein forming the diffusion barrier includes forming the first insulative diffusion barrier layer as a nano-oxide layer.

59. The method of claim 54, wherein forming the diffusion barrier includes forming the second diffusion barrier layer with a laminate of Ru layers, each Ru layer having a thickness such that its coupling in the pinned layer is ferromagnetic.

60. The method of claim 54, wherein forming the diffusion barrier includes forming the first insulative diffusion barrier layer as a native oxide having a thickness ranging from about a monolayer to about seven angstroms.

61. The method of claim 54, wherein forming the diffusion barrier includes forming the first insulative diffusion barrier layer as an aluminum oxide with a thickness ranging from about a monolayer to about seven angstroms.

62. A method of forming a system having a magnetic random access memory device, the method comprising:
providing a processor;
coupling a magnetic random access memory to the processor, the magnetic random access memory having a plurality of magnetic random access memory devices formed on a substrate, each magnetic random access memory devices formed by a method including:
forming a sense layer;
forming a tunnel baffler contacting the sense layer; and
forming a pinned layer having a diffusion baffler, the pinned layer contacting the tunnel baffler, the tunnel baffler separating the sense layer and the pinned layer, including forming the diffusion baffler having:
a first insulative diffusion baffler layer;
a second diffusion baffler layer; and
a ferromagnetic layer between and contacting the first insulative diffusion baffler layer and the second diffusion baffler layer.

63. The method of claim 62, the method further including annealing the sense layer, the tunnel baffler and the pinned layer.

64. The method of claim 62, wherein forming a sense layer includes forming the sense layer on a substrate.

65. The method of claim 62, wherein forming a pinned layer includes forming the pinned layer on a substrate.

66. The method of claim 62, wherein forming the diffusion barrier includes forming the first insulative diffusion barrier layer as a nano-oxide layer.

67. The method of claim 62, wherein forming the diffusion barrier includes forming the second diffusion barrier layer with a laminate of Ru layers, each Ru layer having a thickness such that its coupling in the pinned layer is ferromagnetic.

68. The method of claim 62, wherein forming the diffusion barrier includes forming the second diffusion barrier layer as a native oxide having a thickness ranging from about a monolayer to about seven angstroms.

69. The method of claim 62, wherein forming the diffusion barrier includes forming the first insulative diffusion barrier layer as an aluminum oxide with a thickness ranging from about a monolayer to about seven angstroms.

* * * * *

UNITED STATES PATENT AND TRADEMARK OFFICE
CERTIFICATE OF CORRECTION

PATENT NO. : 7,002,228 B2
DATED : February 21, 2006
INVENTOR(S) : Deak et al.

It is certified that error appears in the above-identified patent and that said Letters Patent is hereby corrected as shown below:

<u>Title page,</u>
Item [56], References Cited, U.S. PATENT DOCUMENTS, delete "2005/0003562" and insert -- 2005/0003561 --.

<u>Column 14,</u>
Line 42, delete "bamer" and insert -- barrier --.
Line 58, delete "cobalt iron" and insert -- cobalt-iron --.

<u>Column 15,</u>
Lines 1-2 and 4-5, delete "manganese containing" and insert
-- manganese-containing --.
Line 51, delete "bamer" and insert -- barrier --.

<u>Column 16,</u>
Lines 24, 27, 28, 29, 30, 32, 33 and 35, delete "baffler" and insert -- barrier --.
Lines 25 and 26, "baffler," and insert -- barrier, --.

Signed and Sealed this

Thirtieth Day of May, 2006

JON W. DUDAS
*Director of the United States Patent and Trademark Office*